US012692335B2

(12) United States Patent
Choi et al.

(10) Patent No.: US 12,692,335 B2
(45) Date of Patent: Jul. 28, 2026

(54) PHOTOSENSITIVE POLYMER AND RESIST COMPOSITION HAVING THE SAME

(71) Applicants: OLAS CO., LTD., Cheonan-si (KR); CHEMPOLE CO., LTD., Suwon-si (KR)

(72) Inventors: Sang Jun Choi, Seoul (KR); Youngsun Kim, Hwaseong-si (KR); Jaebuem Oh, Daejeon (KR)

(73) Assignees: OLAS CO., LTD., Cheonan-si (KR); CHEMPOLE CO., LTD., Suwon-si (KR)

( * ) Notice: Subject to any disclaimer, the term of this patent is extended or adjusted under 35 U.S.C. 154(b) by 860 days.

(21) Appl. No.: 17/670,602

(22) Filed: Feb. 14, 2022

(65) Prior Publication Data

US 2022/0259354 A1 Aug. 18, 2022

(30) Foreign Application Priority Data

Feb. 15, 2021 (KR) ........................ 10-2021-0019837

(51) Int. Cl.

| | |
|---|---|
| ***C08F 226/06*** | (2006.01) |
| ***C08F 212/06*** | (2006.01) |
| ***C08F 220/06*** | (2006.01) |
| ***C08F 224/00*** | (2006.01) |
| ***G03F 7/004*** | (2006.01) |
| ***G03F 7/039*** | (2006.01) |
| ***G03F 7/11*** | (2006.01) |
| ***G03F 7/20*** | (2006.01) |
| ***G03F 7/32*** | (2006.01) |
| ***G03F 7/38*** | (2006.01) |
| ***G03F 7/40*** | (2006.01) |

(52) U.S. Cl.

CPC .......... *C08F 226/06* (2013.01); *C08F 212/06* (2013.01); *C08F 220/06* (2013.01); *C08F 224/00* (2013.01); *G03F 7/0045* (2013.01); *G03F 7/0392* (2013.01); *G03F 7/11* (2013.01); *G03F 7/2006* (2013.01); *G03F 7/322* (2013.01); *G03F 7/38* (2013.01); *G03F 7/40* (2013.01)

(58) Field of Classification Search

CPC .... C08F 226/06; C08F 212/06; C08F 220/06; C08F 224/00; G03F 7/0045; G03F 7/0392; G03F 7/11; G03F 7/2006; G03F 7/322; G03F 7/38; G03F 7/40

See application file for complete search history.

(56) References Cited

U.S. PATENT DOCUMENTS

| | | | | |
|---|---|---|---|---|
| 2013/0130177 A1* | 5/2013 | Kobayashi | ............ | G03F 7/0397 430/325 |
| 2013/0130183 A1* | 5/2013 | Kobayashi | ............ | G03F 7/0397 430/325 |

FOREIGN PATENT DOCUMENTS

| | | | | |
|---|---|---|---|---|
| CN | 109206826 A * | 1/2019 | ........... | C08G 81/021 |
| JP | 2001-117227 | 4/2001 | | |
| JP | 2008111103 A * | 5/2008 | ........... | G03F 7/0046 |
| JP | 2011-039266 | 2/2011 | | |
| JP | 2011039266 A * | 2/2011 | | |
| JP | 2011039315 | 2/2011 | | |
| KR | 1020170098186 | 8/2017 | | |
| WO | 2010-098618 | 9/2010 | | |
| WO | 2019225362 | 11/2019 | | |

OTHER PUBLICATIONS

English Translation of JP 2011-039266 A; Hatakeyama Jun; Published: Feb. 24, 2011 (Year: 2011).*
English Translation of JP 2008-111103 A; Harada Yuji; Published: May 15, 2008 (Year: 2008).*
English translation of CN 109206826 A; Unannounced Inventor; Published: Jan. 15, 2019 (Year: 2019).*

* cited by examiner

*Primary Examiner* — Mark F. Huff
*Assistant Examiner* — Richard David Champion
(74) *Attorney, Agent, or Firm* — LEX IP MEISTER, PLLC

(57) ABSTRACT

Disclosed are a photosensitive polymer including a repeating unit of Chemical Formula 1 or Chemical Formula 2 derived from a vinyl heteroaromatic compound and a resist composition including the same.

[Chemical Formula 1]

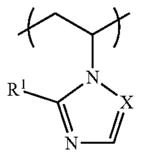

[Chemical Formula 2]

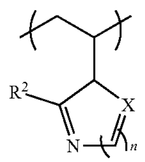

In Chemical Formula 1 or 2, $R^1$ and $R^2$ are hydrogen or a methyl group, X is a carbon, sulfur, or a nitrogen atom, and n is 1 or 2.

8 Claims, No Drawings

PHOTOSENSITIVE POLYMER AND RESIST COMPOSITION HAVING THE SAME

CROSS-REFERENCE TO RELATED APPLICATION

This application claims priority to and the benefit of Korean Patent Application No. 10-2021-0019837 filed in the Korean Intellectual Property Office on Feb. 15, 2021, the entire contents of which are incorporated herein by reference.

BACKGROUND OF THE INVENTION

(a) Field of the Invention

This disclosure relates to a photosensitive polymer including a repeating unit derived from a vinyl heteroaromatic compound, and a resist composition including the same.

(b) Description of the Related Art

As a semiconductor-manufacturing process becomes more complicated and semiconductor device integration is increased, fine pattern formation is required. Further, a resist material using an ArF excimer laser (about 193 nm) which uses a short wavelength is used rather than a conventional resist material using a KrF excimer laser (about 248 nm).

However, as a device having semiconductor device capacity of about 16 gigabits or more requires a pattern size of about 70 nm or less as a design rule, a resist film becomes thinner and thinner, and a process margin in etching an underlying film becomes smaller, which increasingly put more limits in using the resist material using the ArF excimer laser.

The resist material used for lithography using such an ArF excimer laser has many problems in commercialization, compared with the conventional resist material. The most typical problem may be resistance to dry etching of a resist.

As conventional ArF resists known so far, acrylic or methacrylic polymers have been mainly used. Among them, poly(methacrylate)-based polymer materials are most commonly used. These polymers have a serious problem of very insufficient resistance to dry etching. In other words, these materials have difficulty in performing an etching process due to too low selectivity in the dry etching process using plasma gas during the semiconductor device manufacturing process.

Accordingly, in order to increase the resistance to the dry etching, a method of introducing an alicyclic compound, which is a material having strong resistance to the dry etching, for example, an isobornyl group, an adamantyl group, a tricyclodecanyl group, and the like as a substituent of polymers, has been used. However, in order to satisfy solubility in a developing solution and adhesion properties to an underlying film, the polymers mainly have a terpolymer or higher structure, in which an alicyclic group takes a small portion, and thus still have weak resistance to the dry etching. In addition, since the alicyclic compound is hydrophobic, when a large amount thereof is included in the terpolymer structure, adhesion properties to the underlying film of a resist film are deteriorated.

COMA (cycloolefin-maleic anhydride) alternating polymers have been suggested as polymers according to another conventional art. COMA-type copolymers may be manufactured by using low cost raw materials but still have a problem in terms of a synthesis yield and resolution.

In addition, polymers synthesized to have the above structure have a very hydrophobic alicyclic group as a backbone and thus insufficient adhesion properties to a film. Furthermore, the COMA-type photosensitive resin has a disadvantage in storage-stability of a resist composition.

SUMMARY OF THE INVENTION

The present disclosure provides a photosensitive polymer having excellent resistance to dry etching by including a repeating unit derived from a vinyl heteroaromatic compound.

The present disclosure provides a resist composition having very excellent dry etching properties, compared with resist materials for KrF and ArF, and thus is suitable for manufacturing a next-generation semiconductor in the future.

A photosensitive polymer according to embodiments includes a repeating unit of Chemical Formula 1 or Chemical Formula 2 derived from a vinyl heteroaromatic compound.

[Chemical Formula 1]

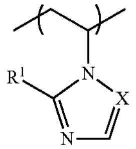

[Chemical Formula 2]

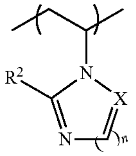

In Chemical Formula 1 or 2, $R^1$ and $R^2$ are hydrogen or a methyl group,

X is a carbon, sulfur, or a nitrogen atom, and n is 1 or 2.

A resist composition according to embodiments includes the photosensitive polymer including a repeating unit represented by Chemical Formula 1 or Chemical Formula 2 derived from a vinyl heteroaromatic compound, a photoacid generator, and an organic solvent.

The photosensitive polymer further includes one or more repeating units derived from a compound selected from Chemical Formula 3, Chemical Formula 4, and Chemical Formula 5.

[Chemical Formula 3]

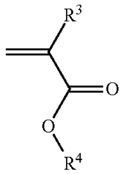

[Chemical Formula 4]

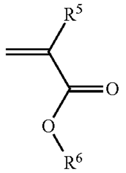

-continued

[Chemical Formula 5]

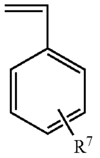

In Chemical Formula 3, Chemical Formula 4, and Chemical Formula 5, $R^3$ and $R^5$ are independently hydrogen or a methyl group, $R^4$ is a C4 to C20 acid-labile group or lactone derivative, which is decomposed in the presence of an acid catalyst, $R^6$ is hydrogen, an alkyl group, or a cycloalkyl group including a polar group selected from a hydroxyl group, a carboxyl group, and a combination thereof, and $R^7$ is hydrogen, an alkyl group, or a cycloalkyl group including a polar group selected from a hydroxyl group, a carboxyl group, a sulfonyl group, and a combination thereof.

The photosensitive polymer according to the embodiments includes a repeating unit derived from a vinyl heteroaromatic compound, and thereby has a low manufacturing cost, excellent etch resistance to dry etching, adhesion to an underlying film, and anti-corrosion in a film made of a metal material.

The resist compositions according to the embodiments have excellent dry etching characteristics and excellent adhesion characteristics to the underlying film compared with conventional resist materials for KrF and ArF, and thus they may be very usefully used in manufacturing next-generation semiconductor devices in the future.

DETAILED DESCRIPTION OF THE EMBODIMENTS

Hereinafter, embodiments will be described in detail so that those of ordinary skill in the art can easily implement them. The embodiments may be implemented in various different forms, and are not limited to the specific embodiments described herein.

Unless the definition of some terms used in the present disclosure is defined otherwise below, all technical and scientific terms used herein have the same meaning as commonly understood by one of ordinary skill in the art to which the present invention belongs.

Unless otherwise specified, "alkyl" refers to a $C_1$ to $C_{20}$ alkyl group, more desirably a $C_1$ to $C_{12}$ alkyl group, "lower alkyl" refers to a $C_1$ to $C_4$ alkyl group, "alkoxy" refers to a $C_1$ to $C_{20}$ alkyl group, more desirably a $C_1$ to $C_{12}$ alkoxy group, "alkylene" refers to a $C_1$ to $C_{20}$ alkylene group, more desirably a $C_1$ to $C_{12}$ alkylene group, "aryl" refers to a $C_6$ to $C_{20}$ aryl group, more desirably a $C_6$ to $C_{12}$ aryl group, and "cycloalkyl" refers to a $C_3$ to $C_{14}$ cycloalkyl group.

A photosensitive polymer according to an embodiment includes a repeating unit of Chemical Formula 1 or Chemical Formula 2 derived from a vinyl heteroaromatic compound.

[Chemical Formula 1]

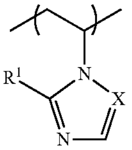

[Chemical Formula 2]

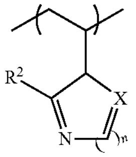

In Chemical Formula 1 or 2, $R^1$ and $R^2$ are hydrogen or a methyl group, X is a carbon, sulfur, or a nitrogen atom, and n is 1 or 2.

Here, the vinyl heteroaromatic compound may be any one selected from the following compounds.

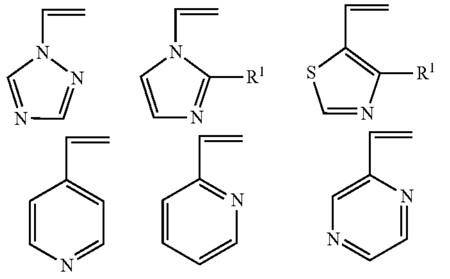

The vinyl heteroaromatic compound may be easily subject to radical polymerization with a (meth)acryl-based monomer or a styrene-based monomer having various functional substituents to synthesize photosensitive polymers (copolymers).

The photosensitive polymers synthesized in the above method have etch resistance to dry etching and simultaneously excellent adhesion properties to an underlying film, and in addition, an anti-corrosion function to a film formed of a metallic material, and thus are very advantageous in forming a resist pattern. As a result, the photosensitive polymers may overcome disadvantages of the conventional KrF or ArF resist materials such as dry etch resistance and adhesion properties to an underlying film and thus sufficiently work as an etching mask in a semiconductor device requiring higher resolution.

The photosensitive polymer includes one or more repeating units derived from a compound selected from Chemical Formula 3, Chemical Formula 4, and Chemical Formula 5 together with the repeating unit composed of the vinyl heteroaromatic compound.

[Chemical Formula 3]

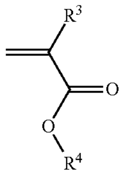

-continued

[Chemical Formula 4]

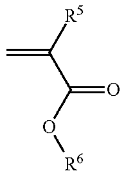

[Chemical Formula 5]

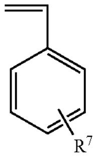

In Chemical Formula 3, Chemical Formula 4, and Chemical Formula 5, $R^3$ and $R^5$ are independently hydrogen or a methyl group, and $R^4$ is a $C_4$ to $C_{20}$ acid-labile group or lactone derivative, which is decomposed in the presence of an acid catalyst.

The acid-labile group may be selected from norbornyl, isobornyl, cyclodecanyl, adamantyl, norbornyl substituted with a lower alkyl group, isobornyl substituted with a lower alkyl group, cyclodecanyl substituted with a lower alkyl group, adamantly substituted with a lower alkyl group, alkoxycarbonyl, alkoxycarbonylalkyl, amyloxycarbonyl, amyloxycarbonylalkyl, 2-tetrahydropyranyloxycarbonylalkyl, 2-tetrahydrofuranyloxycarbonylalkyl, a tertiary alkyl group, and an acetal group, and more desirably 2-methyl-2-norbornyl, 2-ethyl-2-norbornyl, 2-methyl-2-isobornyl, 2-ethyl-2-isobornyl, 8-methyl-8-tricyclodecanyl, 8-ethyl-8-tricyclodecanyl, 2-methyl-2-adamantyl, 2-ethyl-2-adamantyl, 2-propyl-2-adamantyl, t-butoxycarbonyl, t-butoxycarbonylmethyl, t-amyloxycarbonyl, t-amyloxycarbonylmethyl, 1-ethoxyethoxycarbonylmethyl, 2-tetrahydropyranyloxycarbonylalkyl, 2-tetrahydrofuranyloxycarbonylalkyl, a t-butyl group, a triethylcarbyl group, a 1-methyl cyclohexyl group, a 1-ethylcyclopentyl group, a t-amyl group, and an acetal group.

In addition, the lactone derivative may have a substituent having a structure of Chemical Formula 6 or Chemical Formula 7, as a lactone derivative group.

[Chemical Formula 6]

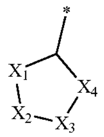

Two of $X_1$ to $X_4$ are independently C═O and O, and the rest other than C═O and O are $CR_8$ wherein $R_8$ is hydrogen, an alkyl, or an alkylene forming a fused ring with a pentagonal ring.

[Chemical Formula 7]

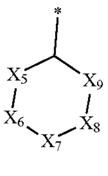

Two of $X_5$ to $X_9$ are independently C═O and O, and the rest other than C═O and O are $CR_9$, wherein $R_9$ is hydrogen, an alkyl, or an alkylene group forming a fused ring with a hexagonal ring, or $X_5$ to $X_9$ are all $CR_9$, wherein $R_9$ is hydrogen, an alkyl, or an ester group-containing alkylene forming a fused ring with a hexagonal ring, and at least two $R_9$ are linked to each other to form a lactone ring.

More desirably, $R_4$ may be selected from butyrolactonyl, valerolactonyl, 1,3-cyclohexane carbolactonyl, 2,6-norbornane carbolacton-5-yl, and 7-oxa-2,6-norbornane carbolacton-5-yl.

$R_6$ may be hydrogen, an alkyl group, or a cycloalkyl group including a polar group selected from a hydroxyl group, a carboxyl group, and a combination thereof. The alkyl group may be a $C_2$ to $C_{14}$ alkyl group and the cycloalkyl group may be a $C_3$ to $C_{14}$ cycloalkyl group. Desirably, it may be 2-hydroxyethyl, 3-hydroxy-1-adamantyl, etc.

$R_7$ may be hydrogen, an alkyl group or a cycloalkyl group including a polar group selected from a hydroxyl group, a carboxyl group, a sulfonyl group, and a combination thereof. The alkyl group may be a $C_2$ to $C_{14}$ alkyl group, and the cycloalkyl group may be a $C_3$ to $C_{14}$ cycloalkyl group. Desirably, it may be hydrogen, a hydroxyl group, fluorine, a methyl group, a methoxy group, etc.

That is, the photosensitive polymer has the form of a random copolymer of the vinyl heteroaromatic compound of Chemical Formula 1 or 2 and the compounds of Chemical Formulas 3 to 5. Desirably, the photosensitive polymer may have a weight average molecular weight (Mw) of about 3000 to about 30,000. More desirably, it may have a weight average molecular weight (Mw) of about 5000 to about 20,000.

In addition, the photosensitive polymer may desirably have polydispersity (Mw/Mn) of about 1.5 to about 2.5. Within the above range, excellent etching resistance and resolution may be exhibited.

The photosensitive polymers according to embodiments of the present invention are in the form of polymers (copolymers) including repeating units derived from vinyl heteroaromatic compounds having new functionality and contribute to obtaining a resist composition having very excellent resistance to dry etching and metal corrosion, compared with the conventional resist materials.

When a resist composition prepared therefrom is applied to a photolithographic process, very excellent lithographic performance may be obtained.

According to another embodiment, a resist composition including the photosensitive polymer is provided.

Specifically, the resist composition includes (a) a photosensitive polymer, (b) a photoacid generator (PAG), and (c) a solvent.

Hereinafter, each component included in the resist composition according to an embodiment is described in detail.

(a) Photosensitive Polymer

The photosensitive polymer is the same as described above. Herein, the photosensitive polymer may be included in an amount of about 5 parts by weight to about 50 parts by weight based on 100 parts by weight of the resist composition. When the photosensitive polymer is included within the content range in the resist composition, excellent etch resistance and adhesion properties may be obtained.

(b) Photoacid Generator (PAG)

The photoacid generator may be selected from inorganic onium salts, organic sulfonates, and a mixture thereof. Specifically, sulfonium salts or iodonium salts selected from triarylsulfonium salts, diaryliodonium salts, sulfonates, or a mixture thereof may be used. More desirably, it may be selected from triarylsulfonium triflate, diaryliodonium triflate, triarylsulfonium nonaflate, diaryliodonium nonaflate, succinimidyl triflate, 2,6-dinitrobenzyl sulfonate, and a mixture thereof.

The photoacid generator may be included in an amount of about 1 part by weight to about 10 parts by weight based on 100 parts by weight of the photosensitive polymer. When the photoacid generator is included in an amount of less than about 1 part by weight, an exposure dose to the resist composition may be excessively increased, but when included in an amount of greater than about 10 parts by weight, there may be a problem of insufficient transmittance to the resist composition.

(c) Organic Solvent

The organic solvent may be one or more types may be selected from propylene glycol monomethyl ether acetate (PGMEA), propylene glycol monomethyl ether (PGME), ethyl lactate (EL), cyclohexanone, 2-heptanone, gamma-butyrolactone (GBL), and the like.

The organic solvent is included as a balance component in the resist composition, but has no particular limit in terms of content and may be included in an amount of about 50 parts by weight to about 95 parts by weight based on 100 parts by weight of the resist composition.

(d) Acid Quencher

The resist composition may additionally include an organic base for controlling the exposure dose and forming a resist profile in addition to the (a) to (c) components.

The organic base is mainly composed of a trivalent amine, for example, an amine-based compound selected from triethylamine, triisobutylamine, trioctylamine, triisodecylamine, triethanolamine, or a mixture thereof.

The organic base may be included in an amount of about 0.01 parts by weight to about 1 part by weight based on 100 parts by weight of the photosensitive polymer. When the organic base is included in an amount of less than about 0.01 parts by weight, the desired effect may not be expected, but when greater than about 1 part by weight, the exposure dose may be excessively increased, and in more severe cases, may fail in forming patterns.

A resist composition having the above composition is used to form a desired pattern in the following process.

A bare silicon wafer or a silicon wafer on which a silicon oxide layer, a silicon nitride layer, a silicon oxynitride layer, or an underlying film including a metal on the upper surface is prepared and then treated with HMDS or an organic anti-reflection coating. Subsequently, on the silicon wafer, the resist composition is coated to form an about 100 nm to about 500 nm-thick resist film.

The silicon wafer having the resist film thereon is soft-baked (SB) within a temperature range of about 90° C. to about 150° C. for about 60 seconds to about 120 seconds to remove a solvent, exposed to light by using various exposure light sources, for example, KrF, ArF, or EUV (extreme UV), E-beam, and the like, and post-exposure baked (PEB) within a temperature range of about 90° C. to about 120° C. for about 60 seconds to about 120 seconds to cause a chemical reaction in an exposure region of the resist film.

Subsequently, the resist film is developed in an about 2.38 wt % tetramethyl ammonium hydroxide (TMAH) solution, wherein the exposure region exhibits very high solubility compared with a basic aqueous solution developing solution, and thus is well dissolved and removed during the development. When the ArF excimer laser is used as an exposure light source, a line and space pattern of about 80 nm to about 100 nm may be formed at a light dose of about 5 mJ/cm$^2$ to about 30 mJ/cm$^2$.

The resist pattern obtained from this process is used as a mask, and the underlying film is etched by using a specific etching gas, for example, plasma such as halogen gas, CxFy gas, or the like. Subsequently, the remaining resist pattern on the wafer is removed by using a stripper, forming a desired pattern.

Hereinafter, the present invention will be described in more detail with reference to examples. However, the following examples are only preferred examples of the present invention, and the present invention is not limited to the following examples.

Example 1) Synthesis of Photosensitive Polymer

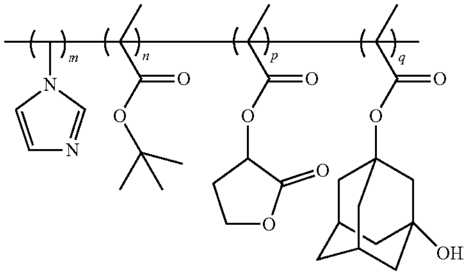

1-vinyl imidazole (20 mmol), t-butyl methacrylate (40 mmol), γ-butyrolactonyl methacrylate (GBLMA) (20 mmol), and 3-hydroxy-1-adamantyl methacrylate (HAMA) (20 mmol) were placed in a round flask and dissolved in a dioxane solvent (at three times the total weight of the monomers), and BPO (2% of the monomer concentration) as a polymerization initiator was added thereto and then purged with nitrogen for about 20 minutes and polymerized at 80° C. for about 20 hours.

When the polymerization was completed, the reactant was slowly precipitated in an excess amount of a co-solvent of methanol/water, and precipitates produced therein were filtered, dissolved in an appropriate amount of THF, and then reprecipitated in a co-solvent of methanol/water.

Subsequently, the obtained precipitates were dried in an 80° C. vacuum oven for 24 hours to synthesize a polymer (Yield: 80%).

The synthesized polymer had a weight average molecular weight (Mw) of 14,900 and polydispersity (Mw/Mn) of 1.7.

Example 2) Synthesis of Photosensitive Polymer

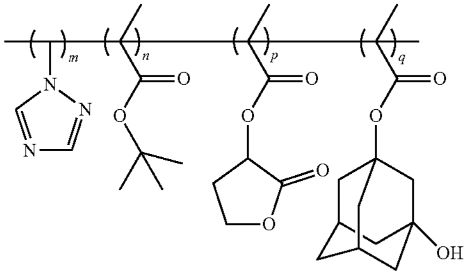

A polymer (Yield: 75%) was synthesized in the same manner as Example 1 except that 1-vinyl-1,2,4-triazole (20 mmol), t-butyl methacrylate (40 mmol), γ-butyrolactonyl methacrylate (GBLMA) (20 mmol), and 3-hydroxy-1-adamantyl methacrylate (HAMA) (20 mmol) were polymerized.

Herein, the obtained polymer had a weight average molecular weight (Mw) of 14,600 and polydispersity (Mw/Mn) of 1.7.

Example 3) Synthesis of Photosensitive Polymer

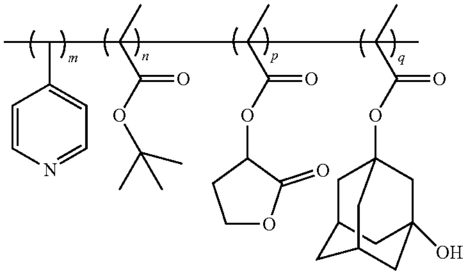

A polymer (Yield: 75%) was synthesized in the same manner as Example 1 except that 4-vinylpyridine (20 mmol), t-butyl methacrylate (40 mmol), γ-butyrolactonyl methacrylate (GBLMA) (20 mmol), and 3-hydroxy-1-adamantyl methacrylate (HAMA) (20 mmol) were polymerized.

Herein, the obtained polymer had a weight average molecular weight (Mw) of 15,500 and polydispersity (Mw/Mn) of 1.7.

Example 4) Synthesis of Photosensitive Polymer

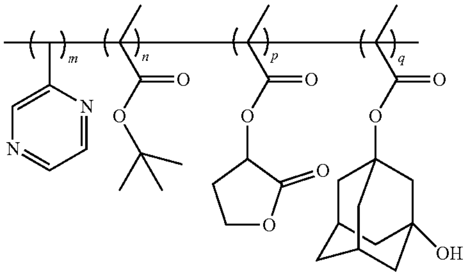

A polymer (Yield: 75%) was synthesized in the same manner as Example 1 except that 2-vinylpyrazine (20 mmol), t-butyl methacrylate (40 mmol), γ-butyrolactonyl methacrylate (GBLMA) (20 mmol), and 3-hydroxy-1-adamantyl methacrylate (HAMA) (20 mmol) were polymerized.

Herein, the obtained polymer had a weight average molecular weight (Mw) of 14,500 and polydispersity (Mw/Mn) of 1.8.

Example 5) Synthesis of Photosensitive Polymer

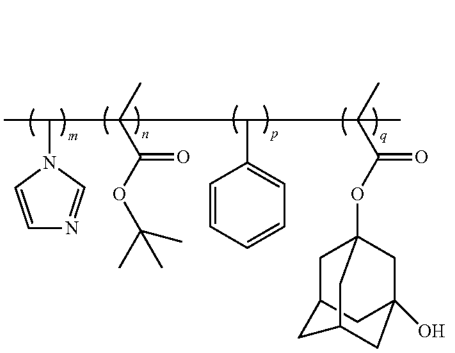

A polymer (Yield: 75%) was synthesized in the same manner as Example 1 except that 1-vinyl imidazole (20 mmol), t-butyl methacrylate (40 mmol), styrene (20 mmol), and 3-hydroxy-1-adamantyl methacrylate (HAMA) (20 mmol) were polymerized.

Herein, the obtained polymer had a weight average molecular weight (Mw) of 14,800 and polydispersity (Mw/Mn) of 1.7.

Example 6) Synthesis of Photosensitive Polymer

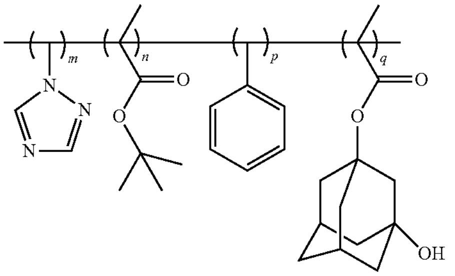

A polymer (Yield: 70%) was synthesized in the same manner as Example 1 except that 1-vinyl-1,2,4-triazole (20 mmol), t-butyl methacrylate (40 mmol), styrene (20 mmol), and 3-hydroxy-1-adamantyl methacrylate (HAMA) (20 mmol) were polymerized.

Herein, the obtained polymer had a weight average molecular weight (Mw) of 14,600 and polydispersity (Mw/Mn) of 1.7.

Example 7) Synthesis of Photosensitive Polymer

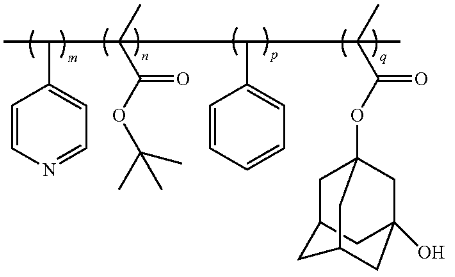

A polymer (Yield: 75%) was synthesized in the same manner as Example 1 except that 4-vinylpyridine (20 mmol), t-butyl methacrylate (40 mmol), styrene (20 mmol), and 3-hydroxy-1-adamantyl methacrylate (HAMA) (20 mmol) were polymerized.

Herein, the obtained polymer had a weight average molecular weight (Mw) of 14,800 and polydispersity (Mw/Mn) of 1.7.

Example 8) Synthesis of Photosensitive Polymer

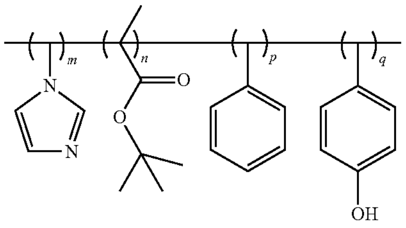

A polymer (Yield: 70%) was synthesized in the same manner as Example 1 except that 1-vinyl imidazole (20 mmol), t-butyl methacrylate (40 mmol), styrene (20 mmol), and 4-hydroxy styrene (20 mmol) were polymerized.

Herein, the obtained polymer had a weight average molecular weight (Mw) of 16,100 and polydispersity (Mw/Mn) of 1.7.

Example 9) Synthesis of Photosensitive Polymer

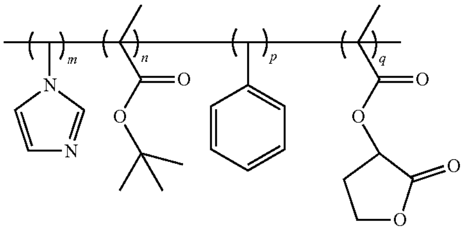

A polymer (Yield: 75%) was synthesized in the same manner as Example 1 except that 1-vinyl imidazole (20 mmol), t-butyl methacrylate (40 mmol), styrene (20 mmol), and γ-butyrolactonyl methacrylate (GBLMA) (20 mmol) were polymerized.

Herein, the obtained polymer had a weight average molecular weight (Mw) of 15,100 and polydispersity (Mw/Mn) of 1.7.

Example 10) Synthesis of Photosensitive Polymer

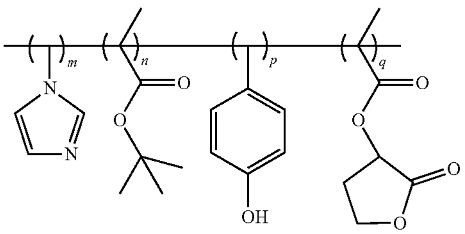

A polymer (Yield: 75%) was synthesized in the same manner as Example 1 except that 1-vinyl imidazole (20 mmol), t-butyl methacrylate (40 mmol), 4-hydroxy styrene (20 mmol), and γ-butyrolactonyl methacrylate (GBLMA) (20 mmol) were polymerized.

Herein, the obtained polymer had a weight average molecular weight (Mw) of 16,200 and polydispersity (Mw/Mn) of 1.7.

Example 11) Synthesis of Photosensitive Polymer

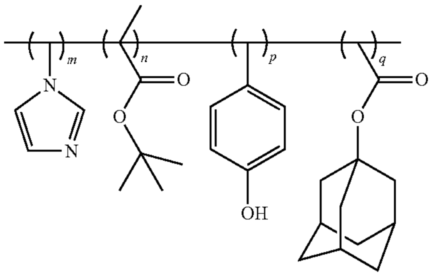

A polymer (Yield: 75%) was synthesized in the same manner as Example 1 except that 1-vinyl imidazole (20 mmol), t-butyl methacrylate (40 mmol), 4-hydroxy styrene (20 mmol), and 1-adamantyl acrylate (20 mmol) were polymerized.

Herein, the obtained polymer had a weight average molecular weight (Mw) of 15,500 and polydispersity (Mw/Mn) of 1.7.

Example 12) Synthesis of Photosensitive Polymer

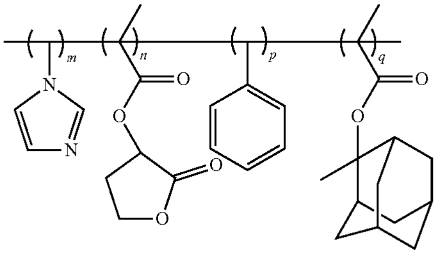

A polymer (Yield: 75%) was synthesized in the same manner as Example 1 except that 1-vinyl imidazole (20 mmol), γ-butyrolactonyl methacrylate (20 mmol), styrene (20 mmol), and 2-methyl-2-adamantyl methacrylate (40 mmol) were polymerized.

Herein, the obtained polymer had a weight average molecular weight (Mw) of 15,300 and polydispersity (Mw/Mn) of 1.7.

Comparative Example) Synthesis of Photosensitive Polymer

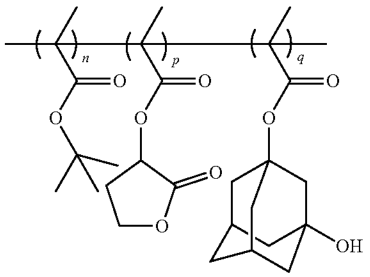

A polymer (Yield: 80%) was synthesized in the same manner as Example 1 except that t-butyl methacrylate (40 mmol), γ-butyrolactonyl methacrylate (GBLMA) (40 mmol), and 3-hydroxy-1-adamantyl methacrylate (HAMA) (20 mmol) were polymerized.

Herein, the obtained polymer had a weight average molecular weight (Mw) of 15,900 and polydispersity (Mw/Mn) of 1.7.

Example 13) Preparation of Resist Composition and Lithographic Performance

The photosensitive polymers according to Example 1 to Example 12 and the comparative example were respectively taken at 1 g and dissolved with triphenylsulfonium nonaflate (0.02 g) in PGMEA/EL (6/4) (17 g), and an organic base of triethanolamine (1 mg) was added thereto and then completely dissolved therein, preparing each resist composition.

Example 14) Evaluation of Resist Resolution

Each resist solution according to Example 13 was filtered with a 0.1 μm membrane filter. Each filtered resist solution was coated to be 140 nm thick on a silicon wafer treated with 600 Å-thick organic BARC (AR46, Rhom & Hass Company) and then, soft-baked (SB) at 130° C. for 60 seconds.

The soft-baked wafer at 20 $mj/cm^2$ to 50 $mj/cm^2$ was exposed to light by using an ArF scanner (0.78 NA, dipole), post-exposure baked (PEB) at 110° C. for 60 seconds, and developed in a 2.38 wt % TMAH solution for 60 seconds. As a result, a clean 90 nm to 100 nm L/S pattern was obtained as shown in Table 1 and exhibited excellent resolution, compared with that obtained from the polymer according to the comparative example.

TABLE 1

| Type of polymer | Exposure energy (Eop) | Resolution |
|---|---|---|
| Example 1 | 30 $mJ/cm^2$ | 90 nm |
| Example 2 | 30 $mJ/cm^2$ | 90 nm |
| Example 3 | 30 $mJ/cm^2$ | 90 nm |
| Example 4 | 30 $mJ/cm^2$ | 90 nm |
| Example 5 | 30 $mJ/cm^2$ | 100 nm |
| Example 6 | 30 $mJ/cm^2$ | 100 nm |
| Example 7 | 30 $mJ/cm^2$ | 100 nm |
| Example 8 | 30 $mJ/cm^2$ | 100 nm |
| Example 9 | 30 $mJ/cm^2$ | 100 nm |
| Example 10 | 30 $mJ/cm^2$ | 100 nm |
| Example 11 | 30 $mJ/cm^2$ | 100 nm |
| Example 12 | 30 $mJ/cm^2$ | 100 nm |
| Comparative example | 30 $mJ/cm^2$ | 120 nm |

Example 15) Evaluation of Etch Resistance

In order to evaluate etch properties of the resist composition according to Example 13, bulk etching thereof was evaluated in a RIE (reactive ion etching) method under $CF_4$ gas (composition; power of 100 W, pressure of 5 Pa, and flow rate of 30 ml/min) conditions. Herein, a polyhydroxystyrene (PHS) polymer (a polymer for KrF), which was a resist for KrF, was normalized based on an etch rate and used as a reference for the evaluation. The results are shown in Table 2, and the polymer of the present invention exhibited an about 1.1 times (normalized) etch rate, compared with that of the polymer for KrF, and thus exhibited very strong etch resistance, while the polymer of the comparative example exhibited an about 1.5 times etch rate.

TABLE 2

| Type of polymer | PHS (normalized) | Etch-rate (%) |
|---|---|---|
| Example 1 | 100% | 110 |
| Example 2 | 100% | 110 |
| Example 3 | 100% | 110 |
| Example 4 | 100% | 110 |
| Example 5 | 100% | 108 |
| Example 6 | 100% | 108 |
| Example 7 | 100% | 108 |
| Example 8 | 100% | 103 |
| Example 9 | 100% | 105 |
| Example 10 | 100% | 105 |
| Example 11 | 100% | 103 |
| Example 12 | 100% | 102 |
| Comparative example | 100% | 150 |

Although various embodiments have been described above, the scope of the rights is not limited thereto. The embodiments can be implemented with various modifications within the scope of the detailed description and accompanying drawings of the invention, and it is natural that this also falls within the scope of rights.

What is claimed is:

1. A photosensitive polymer, comprising a repeating unit (1) of a vinyl heteroaromatic compound, wherein the vinyl heteroaromatic compound is any one selected from the following compounds:

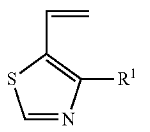 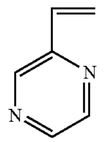 .

wherein $R^1$ is hydrogen or a methyl group, a repeating unit (2) of the following Chemical formula:

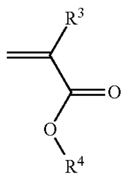

wherein, $R^3$ is hydrogen or a methyl group, and $R^4$ is a tertiary alkyl group, a repeating unit (3) of the following Chemical formula:

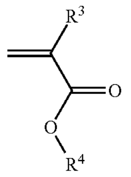

wherein, $R^3$ is hydrogen or a methyl group, and $R^4$ is a lactone derivative, and a repeating unit (4) of the following Chemical formula:

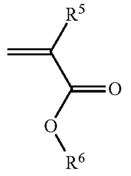

wherein, $R^5$ is hydrogen or a methyl group, $R^6$ is a cycloalkyl group including a polar group selected from a hydroxyl group, a carboxyl group, and a combination thereof.

2. The photosensitive polymer of claim 1, wherein the lactone derivative has a substituent having a structure of Chemical Formula 6:

[Chemical Formula 6]

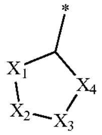

wherein, in Chemical Formula 6, two of $X_1$ to $X_4$ are independently C═O and O, and the rest other than C═O and O are $C(R^8)_2$ wherein $R_8$ is hydrogen, an alkyl, or an alkylene forming a fused ring with a pentagonal ring.

3. The photosensitive polymer of claim 2, wherein the lactone derivative is butyrolactonyl, valerolactonyl, 1,3-cyclohexanecarbolactonyl, 2,6-norbornanecarbolacton-5-yl, or 7-oxa-2,6-norbornanecarbolacton-5-yl.

4. The photosensitive polymer of claim 1, wherein the photosensitive polymer has a weight average molecular weight (Mw) of about 3000 to about 30,000.

5. A resist composition, comprising:

(a) the photosensitive polymer of claim 1;

(b) a photoacid generator (PAG); and (c) an organic solvent.

6. The resist composition of claim 5, wherein the photosensitive polymer is included in an amount of about 5 to about 50 parts by weight based on 100 parts by weight of the resist composition.

7. The resist composition of claim 5, wherein the photoacid generator is included in an amount of about 1 part by weight to about 10 parts by weight based on 100 parts by weight of the resist composition.

8. The resist composition of claim 5, wherein the resist composition further comprises about 0.01 parts by weight to about 1 part by weight of an organic base based on 100 parts by weight of the resist composition.

* * * * *